United States Patent
Lindberg et al.

(10) Patent No.: US 7,756,188 B2
(45) Date of Patent: Jul. 13, 2010

(54) SEMICONDUCTOR DEVICE WITH CORNER REFLECTOR

(75) Inventors: Hans Lindberg, Lappersdorf (DE); Stefan Illek, Donaustauf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/208,814

(22) Filed: Sep. 11, 2008

(65) Prior Publication Data
US 2009/0080481 A1   Mar. 26, 2009

(30) Foreign Application Priority Data
Sep. 11, 2007   (DE) .................. 10 2007 043 189
Nov. 8, 2007   (DE) .................. 10 2007 053 296

(51) Int. Cl.
   *H01S 3/08*   (2006.01)
(52) U.S. Cl. .......................... 372/99; 372/92
(58) Field of Classification Search ............ 372/50.124, 372/70, 99, 92, 94
   See application file for complete search history.

(56) References Cited

U.S. PATENT DOCUMENTS

| 7,035,508 | B2 | 4/2006 | Wu et al. | |
| 7,408,972 | B2 * | 8/2008 | Schmid et al. | 372/99 |
| 2002/0075935 | A1 | 6/2002 | Clayton | |
| 2004/0022286 | A1 * | 2/2004 | Spath et al. | 372/43 |
| 2004/0156413 | A1 | 8/2004 | Henrichs | |
| 2005/0008056 | A1 | 1/2005 | Albrecht et al. | |
| 2006/0104327 | A1 | 5/2006 | Karnutsh et al. | |
| 2007/0201531 | A1 | 8/2007 | Schmid et al. | |

FOREIGN PATENT DOCUMENTS

DE     102 41 192    3/2004
WO   WO 2005/048423   5/2005

* cited by examiner

*Primary Examiner*—Armando Rodriguez
(74) *Attorney, Agent, or Firm*—Cohen Pontani Lieberman & Pavane LLP

(57) ABSTRACT

A semiconductor laser device (5) comprising at least one semiconductor laser chip (7) is provided, wherein the semiconductor laser chip (7) contains an active layer that emits electromagnetic radiation. Further, at least one corner reflector (1) is formed in the semiconductor laser chip (7). The corner reflector (1) has a first and a second reflective surface (14, 15), wherein the first and the second reflective surface (14, 15) are arranged at an angle of less than 90 degrees with respect to one another. This results in an improved emission characteristic of the radiation emitted by the semiconductor laser device (5).

16 Claims, 3 Drawing Sheets

SEMICONDUCTOR DEVICE WITH CORNER REFLECTOR

RELATED APPLICATIONS

This patent application claims the priorities of German patent application 10 2007 043 189.0 filed Sep. 11, 2007 and of German patent application 10 2007 053 296.4 filed Nov. 8, 2007, the disclosure contents of both of which are hereby incorporated by reference.

FIELD OF THE INVENTION

The invention relates to a semiconductor device comprising a semiconductor laser chip and a corner reflector.

BACKGROUND OF THE INVENTION

Laser devices comprising a corner reflector are known for example from the document U.S. Pat. No. 7,035,508 B2, the content of which is hereby incorporated by reference. These devices have a waveguide with a corner reflector arranged at the end of said waveguide.

Corner reflectors comprise at least two reflective surfaces arranged at an angle of 90° with respect to one another. Radiation impinging on one of the surfaces is reflected back by double reflection at both surfaces in the direction from which the radiation came. This means that the radiation impinges on the first reflective surface of the corner reflector, is reflected from the first reflective surface of the corner reflector onto the second reflective surface of the corner reflector and is reflected from the second reflective surface such that the emerging beams and the incident beams run parallel to one another.

Furthermore, the document US 2007/0201531 (the content of which is hereby incorporated by reference) describes an optically pumped semiconductor laser device having a surface emitting vertical emission region and a monolithically integrated pump radiation source for optically pumping the vertical emission region. The pump radiation source can have two straight resonator end mirrors arranged at right angles to one another. These devices have the disadvantage, however, that a disturbed distribution of the radiation emitted by the device arises in the emission profile of the laser device on account of the right angle of the corner reflector. The disturbed distribution arises owing to the fact that radiation which impinges on or in the vicinity of the point of intersection of the two reflector surfaces of the corner reflector does not follow the beam path of double reflection as described above. As a result, an undesirable intensity minimum can arise in the emission profile of the corner reflector, said intensity minimum being visible for example as dark stripes.

Furthermore, devices described in the document U.S. Pat. No. 7,035,508 B2 have the disadvantage that these devices can only be employed for index-guided structures. In order to define a laser mode, these devices have to have a ridge waveguide.

SUMMARY OF THE INVENTION

One object of the invention is to provide a semiconductor laser device having an improved emission characteristic of the radiation emitted by the device.

This and other objects are attained in accordance with one aspect of the present invention directed to a semiconductor laser device comprising at least one semiconductor laser chip, wherein the semiconductor laser chip contains an active layer that emits electromagnetic radiation. Further, at least one corner reflector is formed in the semiconductor laser chip. The corner reflector has a first and a second reflective surface, wherein the first and the second reflective surface are arranged at an angle of less than 90 degrees with respect to one another.

Preferably, the first and the second reflective surface are arranged at an angle of more than 70 degrees and less than 90 degrees with respect to one another.

This arrangement of the reflective surfaces of the corner reflector results in an improved emission characteristic of the radiation emitted by the semiconductor laser device. The intensity minimum that can occur at a right angle of the corner reflector is largely avoided by an angle of less than 90 degrees of the reflective surfaces with respect to one another, thereby largely avoiding dark stripes in the emission profile of the semiconductor laser device. The efficiency and the emission quality of the device increase as a result. An improved emission characteristic is advantageously achieved.

In accordance with at least one embodiment of the semiconductor laser device, the corner reflector is produced by means of dry etching. A coating of the surfaces of the corner reflector is advantageously necessary only to a limited extent. The requirements made of the coating of the surfaces of the corner reflector are advantageously reduced. By way of example, a single layer can be used instead of a reflection-increasing layer sequence. This advantageously reduces the production costs and the production time of such a semiconductor laser device.

In accordance with at least one further embodiment of the semiconductor laser device, the beams emitted by the active layer impinge as incident beams on the first reflective surface of the corner reflector, are reflected from the first reflective surface onto the second reflective surface and are reflected from the second reflective surface such that the emerging beams and the incident beams do not run parallel to one another.

Preferably, the incident beams and the emerging beams define a beam path, and the incident beams and the emerging beams intersect one another.

The incident and the emerging beams preferably form a self-contained beam path. Preferably, all the beams in the resonator form a self-contained beam path. As a result, the radiation emitted by the semiconductor laser device advantageously has a maximum efficiency.

The efficiency of the laser chip can advantageously be increased by the non-parallel beam path of the incident and emerging beams and by the point of intersection of the incident and emerging beams. Furthermore, an improved emission characteristic of the laser chip advantageously results since the intensity minimum occurring at a right angle of the corner reflector is largely avoided.

Hereinafter the term point of intersection does not denote a point in the mathematically correct sense. Rather, hereinafter the term point of intersection can denote a two-dimensional or three-dimensional region, for example an area of intersection or a volume of intersection, at which the beams of the radiation emitted by the active layer intersect one another.

The angle between the reflective surfaces of the corner reflector can preferably be arranged such that the point of intersection of the incident and the emerging beams at which maximum radiation intensity is obtained is arranged at the area at which the radiation emerges from the semiconductor laser chip. A maximum emission intensity of the radiation of the semiconductor laser chip can be achieved as a result.

Preferably, the incident beams and the emerging beams form a beam path that does not meet the point of intersection of the first and the second reflective surface of the corner reflector. The beam path thus provided in the resonator makes it possible largely to avoid dark stripes in the emission profile of the laser chip since the right angle of the corner reflector and the associated intensity minimum occurring at the right angle of the corner reflector are largely avoided. An improved large distribution of the radiation emitted by the laser chip can thus be obtained.

Preferably, the first reflective surface of the corner reflector and the incident beams are at an angle of greater than 20 degrees and less than 45 degrees with respect to one another. As a result, the omission of dark stripes in the emission profile of the laser chip can preferably furthermore be obtained.

In accordance with at least one embodiment of the semiconductor laser device, the first and the second reflective surface of the corner reflector are arranged with respect to one another such that the incident beams and the emerging beams experience total reflection at them. As a result, optical losses can largely be avoided in the resonator.

In accordance with at least one embodiment, the semiconductor laser chip is formed as an edge emitter. In an edge emitter, as a result of reducing the angle between the surfaces of the corner reflector, it is possible to obtain a maximum intensity of the radiation emitted by the edge emitter at that edge of the chip which is provided for the emission of the radiation. Furthermore, an improved emission characteristic of the emitted radiation of the edge emitter is achieved. Dark stripes in the emission profile of the radiation are largely avoided.

In accordance with at least one further embodiment of the semiconductor laser device, the semiconductor laser chip forms a pump radiation source, wherein a surface emitting vertical emitter laser optically pumped by the pump radiation emitted by the active layer is arranged on regions of the pump radiation source.

The semiconductor laser device is preferably formed in such a way that the vertical emitter laser is arranged on regions of the pump radiation source which are electrically pumped. Preferably, the regions of the pump radiation source which form the resonator for the radiation emitted by the active layer of the pump radiation source are electrically pumped. This advantageously reduces losses of the radiation emitted by the active layer of the pump radiation source which can arise as a result of absorption in non-pumped regions of the active layer of the pump radiation source. Furthermore, only those regions of the pump radiation source are electrically pumped which form the resonator for the radiation emitted by the active layer of the pump radiation source, which therefore optically pump the vertical emitter laser and which consequently contribute to the light generation of the semiconductor laser device. The efficiency of the radiation emitted by the semiconductor laser device is thereby increased overall.

An angle between the surfaces of the corner reflectors which is less than 90 degrees results in improved optical pumping of the vertical emitter laser by the pump radiation source. Furthermore, optical losses in the resonator of the pump radiation source can largely be avoided.

In accordance with at least one further embodiment of the semiconductor laser device, a further corner reflector is formed in the semiconductor laser chip on a side opposite the corner reflector, said further corner reflector having two reflective surfaces arranged at an angle of less than 90 degrees with respect to one another, and the corner reflectors jointly form a resonator for the radiation emitted by the active layer.

Preferably, the beam path of the pump radiation between the corner reflectors has a point of intersection that is advantageously arranged below the vertical emitter laser. A high intensity of the pump radiation can thereby be achieved in regions of the semiconductor laser device in which optical pumping is preferably intended to occur.

Preferably, the vertical emitter laser has at least one active radiation-generating vertical emitter layer which emits radiation in a vertical main radiation direction and is at a distance from the active layer of the pump radiation source in the vertical main radiation direction.

Preferably, an interlayer is arranged between the pump radiation source and the vertical emitter laser, which interlayer couples out the pump radiation of the pump radiation source from the resonator of the pump radiation source and couples it into the vertical emitter laser.

In accordance with at least one embodiment of the semiconductor laser device, the vertical emitter laser has a resonator mirror arranged perpendicular to the vertical main radiation direction. The resonator mirror is preferably arranged between the vertical emitter layer and the substrate. In this case, the radiation generated by the vertical emitter layer is coupled out on that side of the vertical emitter laser which is opposite to the substrate ("top emitter"). Alternatively, the resonator mirror can be arranged on that side of the vertical emitter layer which is opposite to the substrate. In this case, the radiation generated by the vertical emitter layer is coupled out through the substrate or on the substrate side, for example through an opening in the substrate ("bottom emitter").

Preferably, the vertical emitter layer is assigned an external mirror which, together with the resonator mirror, forms the resonator for the vertical emitter laser.

The resonator mirror is preferably a Bragg reflector.

In a further embodiment of the semiconductor laser device, a plurality of corner reflectors is arranged around the vertical emitter layer in star-shaped fashion.

Preferably, the corner reflectors are arranged with respect to one another such that a further corner reflector is formed in each case on a side opposite a corner reflector.

Preferably, each corner reflector is formed in such a way that the beams emitted by the active layer in each case impinge as incident beams on the first reflective surface of an corner reflector, are reflected from the first reflective surface onto the second reflective surface and are reflected from the second reflective surface such that the emerging beams and the incident beams do not run parallel to one another and intersect one another.

Corner reflectors are preferably arranged with respect to one another such that the points of intersection of the incident beams and the emerging beams of the individual corner reflectors overlap, wherein the points of intersection are preferably arranged below the vertical emitter layer.

High pump radiation intensity can be obtained in the region of the points of intersection. This advantageously results in an improved emission characteristic of the pump radiation source, whereby homogeneous optical pumping by the pump radiation source is made possible. That region of the points of intersection of the incident and emerging beams of the individual corner reflectors which is preferably arranged below the vertical emitter layer provides a high intensity of the pump radiation in regions of the semiconductor laser device in which optical pumping of the vertical emitter layer is preferably intended to take place.

In accordance with at least one further embodiment of the semiconductor laser device, the corner reflectors are arranged with respect to one another such that the corner reflectors form a resonator in which a circulating beam path is formed.

The active layer of the pump laser preferably has a pn-junction, a double heterostructure, a single quantum well structure or a multiple quantum well structure (MQW) for generating radiation. In the context of the application, the designation quantum well structure encompasses in particular any structure in which charge carriers may experience a quantization of their energy states as a result of confinement. In particular, the designation quantum well structure does not comprise any indication about the dimensionality of the quantization. It therefore encompasses, inter alia, quantum wells, quantum wires and quantum dots and any combination of these structures.

Further features, advantages, preferred embodiments and expediencies of the semiconductor laser device will become apparent from the exemplary embodiments explained below in conjunction with the figures.

DETAILED DESCRIPTION OF THE DRAWINGS

Identical or identically acting constituent parts are in each case provided with the same reference symbols. The constituent parts illustrated and also the size relationships of the constituent parts among one another should not necessarily be regarded as true to scale.

Figure 1:
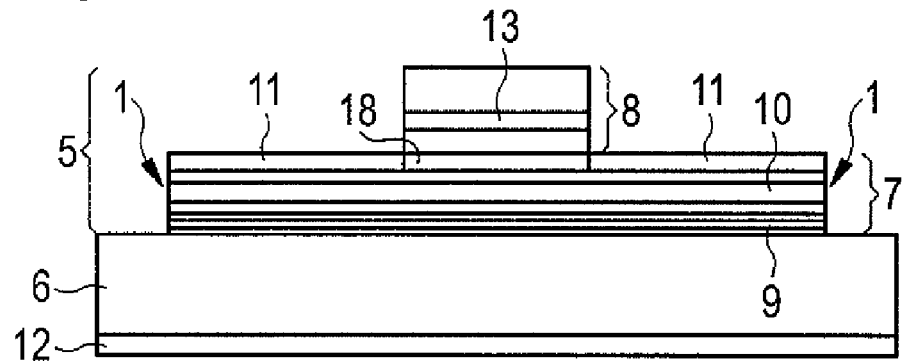
FIG. 1 shows a schematic cross section of a first exemplary embodiment of a semiconductor laser device according to the invention.

In the case of the semiconductor laser device 5 illustrated in FIG. 1, a surface emitting vertical emitter laser 8 is arranged on a semiconductor chip 7 formed as a pump radiation source. The semiconductor laser device 5 is arranged on a substrate 6.

On a main area remote from the pump radiation source 7, the substrate 6 has a contact area 12 for making electrical contact with the pump radiation source 7. In order further to make contact with the pump radiation source 7, an electrical contact layer 11 is preferably applied on a side remote from the substrate 6. The contact layer 11 has a cutout in a region on which the vertical emitter laser 8 is applied.

The surface emitting vertical emitter laser 8 has an active radiation-generating vertical emitter layer 13. The pump radiation source 7 has a resonator 10, in which is arranged an active layer that emits electromagnetic radiation in a main radiation direction. This is referred to herein as the incident beam. The active radiation-generating vertical emitter layer 13 is at a distance from the resonator 10 of the pump radiation source 7 in the vertical main radiation direction.

An interlayer 18 is arranged between the pump radiation source 7 and the vertical emitter laser 8. The interlayer 18 couples out the pump radiation of the pump radiation source 7 from the pump resonator 10 of the pump radiation source 7 and couples it into the vertical emitter laser 8.

The resonator 10 of the pump radiation source 7 has a respective corner reflector 1 at two mutually opposite ends of the resonator 10. The corner reflectors 1 each have a first and a second reflective surface, wherein the first and the second reflective surface are arranged at an angle of less than 90 degrees with respect to one another. Preferably, the first and the second reflective surface are arranged at an angle of more than 70 degrees and less than 90 degrees with respect to one another.

The pump radiation source 7 emits in a pump main radiation direction pump radiation that runs transversely with respect to the vertical main radiation direction. The active layer 13 of the vertical emitter laser 8 is optically pumped by the pump radiation of the pump radiation source 7.

An angle between the surfaces of the corner reflectors which is less than 90 degrees results in improved optical pumping of the vertical emitter laser 8 by the pump radiation source 7.

The surfaces of the corner reflectors 1 are arranged with respect to one another such that radiation situated in the resonator 10 of the pump radiation source 7 experiences total reflection at surfaces of the corner reflectors 1. A low optical loss of the pump radiation is advantageously achieved as a result. Optical losses in the resonator 10 can thus largely be advantageously avoided.

The corner reflectors are preferably produced by dry etching. A coating of the surfaces of the corner reflectors 1 is advantageously necessary only to a limited extent. The requirements made of the coating of the surfaces of the corner reflector 1 are advantageously reduced. By way of example, a single layer can be used instead of a reflection-increasing layer sequence. This preferably reduces the production costs and the production time of such a semiconductor laser device 5.

Preferably, the vertical emitter laser 8 has a resonator mirror 9, preferably a Bragg reflector. The resonator mirror 9 is preferably arranged perpendicularly to the vertical main radiation direction. In FIG. 1, the resonator mirror 9 is arranged between the pump radiation source 7 and the substrate 6. In this case, the radiation generated by the vertical emitter layer 13 is coupled out on a side of the vertical emitter laser 8 which is opposite to the substrate 6 ("top emitter". Alternatively, the resonator mirror 9 can be arranged on that side of the vertical emitter layer 13 which is opposite to the substrate 6. In this case, the radiation generated by the vertical emitter layer 13 is coupled out through the substrate 6 or through an opening in the substrate ("bottom emitter").

Preferably, the vertical emitter layer 13 is assigned an external mirror which, together with the resonator mirror 9, forms a resonator for the vertical emitter laser 8 (not illustrated).

Preferably, the active layer of the pump radiation source 7 has a pn-junction, a double heterostructure, a single quantum well structure or a multiple quantum well structure (MQW) for generating radiation. In the context of the application, the designation quantum well structure encompasses in particular any structure in which charge carriers may experience a quantization of their energy states as a result of confinement. In particular, the designation quantum well structure does not comprise any indication about the dimensionality of the quantization. It therefore encompasses, inter alia, quantum wells, quantum wires and quantum dots and any combination of these structures.

Preferred exemplary embodiments of the resonator 10 of the pump radiation source 7 and of the beam path 2 of the radiation situated in the resonator 10 are illustrated in FIG. 2a and FIGS. 4a to 4d.

Figure 2A:
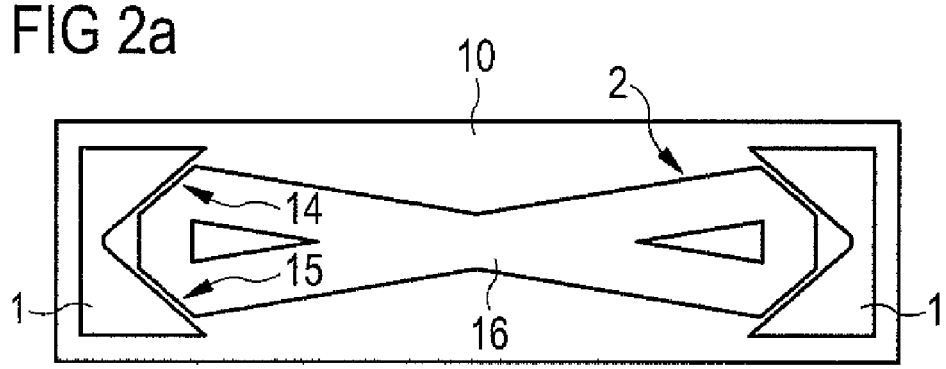
FIG. 2A shows a schematic plan view of a resonator of a semiconductor laser chip of a semiconductor laser device according to an embodiment of the invention which is formed as a pump radiation source.

FIG. 2a illustrates an exemplary embodiment of a resonator 10 of the pump radiation source of the semiconductor laser device from FIG. 1. A respective corner reflector 1 is arranged at the two opposite ends of the resonator 10. The first surface 14 and the second surface 15 of the corner reflectors 1 are arranged at an angle of less than 90° with respect to one another.

This arrangement of the reflective surfaces 14, 15 of the corner reflector 1 results in an improved emission characteristic of the radiation emitted by the semiconductor laser device. An angle of less than 90° of the reflective surfaces 14, 15 with respect to one another largely prevents dark stripes in the emission profile of the semiconductor laser device since the intensity minimum appearing at a right angle is largely avoided. The efficiency and the emission quality of the device are increased as a result. An improved emission characteristic is advantageously achieved.

A beam path 2 forms in the resonator 10 between the two corner reflectors 1. The beam path 2 preferably has a point of intersection 16 of the radiation. The point of intersection 16 of the beam path 2 results from the angle between the surfaces 14, 15 of the corner reflectors 1.

A maximum radiation intensity of the pump radiation source is advantageously obtained at the point of intersection 16 of the beam path 2. Furthermore, improved optical pumping of the vertical emitter laser by the pump radiation of the pump radiation source preferably results at the point of intersection 16.

The corner reflectors 1 are preferably arranged with respect to one another such that the radiation emitted by the active layer intersects one another, wherein the point of intersection is arranged below the vertical emitter layer. A high intensity of the pump radiation can thereby be achieved in regions of the semiconductor laser device in which optical pumping is preferably intended to occur.

Preferably, the beam path 2 does not meet the point of intersection of the first and the second reflective surface 14, 15 of the corner reflector 1. The beam path 2 thus provided in the resonator 10 makes it possible largely to avoid dark stripes in the emission profile of the pump radiation source since the intensity minimum occurring at a right angle is avoided. An improved light distribution of the radiation emitted by the pump radiation source can thus be obtained.

Figure 2B:
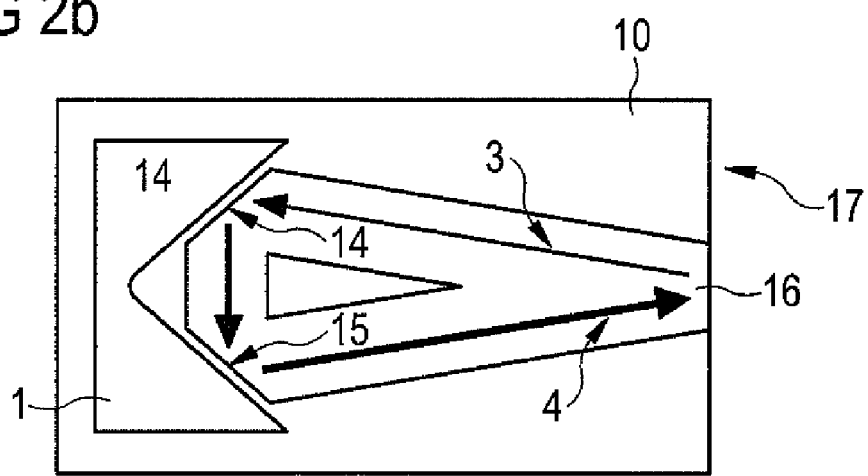
FIG. 2B shows a schematic plan view of a further resonator of a semiconductor laser chip of a semiconductor laser device according to an embodiment of the invention which is formed as an edge emitter.

FIG. 2b represents an exemplary embodiment of a resonator 10 of a semiconductor laser chip which is formed as an edge emitter. Arranged at one end of the resonator 10 is a corner reflector 1 having two surfaces 14, 15 arranged at an angle of less than 90 degrees with respect to one another.

The incident beams 3 incident on the first reflective surface 14 are reflected from the first reflective surface 14 onto the second reflective surface 15, and are reflected from the second reflective surface 15 as emerging beams 4 in such a way that the emerging beams 4 and the incident beams 3 do not run parallel to one another.

The incident beams 3 and the emerging beams 4 preferably intersect one another. By means of the non-parallel beam path of the incident and emerging beams 3, 4 and by means of the point of intersection 16 of the incident and emerging beams 3, 4, it is possible advantageously to increase the efficiency of the edge emitter at the point of intersection 16. Furthermore, an improved emission characteristic of the edge emitter advantageously results.

The angle between the reflective surfaces 14, 15 of the corner reflector 1 can preferably be arranged in such a way that the point of intersection 16 of the incident and emerging beams 3, 4 at which a maximum radiation intensity is obtained is arranged at the chip edge 17 provided for the emission of the radiation. As a result, a maximum emission intensity of the radiation emitted by the edge emitter can be obtained at the chip edge 17 provided for the emission of the radiation. Furthermore, an improved emission characteristic of the emitted radiation of the edge emitter is achieved. Dark stripes in the emission profile of the radiation are largely avoided.

Preferably, the incident beams 3 and the emerging beams 4 form a beam path that does not meet the point of intersection of the first and the second reflective surface 14, 15 of the corner reflector 1. The beam path thus provided in the resonator 10 makes it possible largely to avoid dark stripes in the emission profile of the edge emitter since the intensity minimum occurring at a right angle is largely avoided. An improved light distribution of the radiation emitted by the edge emitter can thus be obtained.

Preferably, the first reflective surface 14 of the corner reflector 1 and the incident beams 3 are at an angle of less than 45 degrees with respect to one another. Omission of dark stripes in the emission profile of the edge emitter can preferably furthermore, be obtained as a result.

Figure 3A:
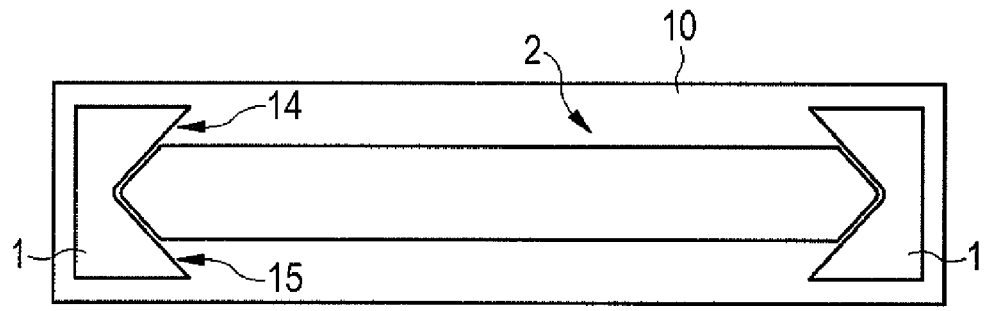
FIG. 3A shows a schematic plan view of a resonator of a conventional semiconductor laser chip which is formed as a pump radiation source.
Figure 3B:
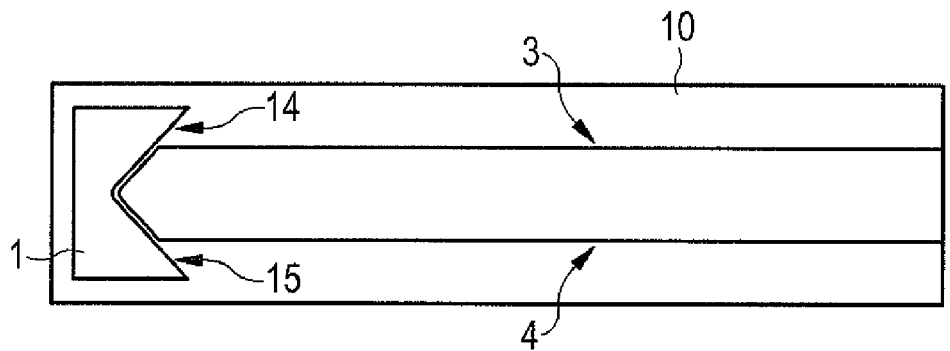
FIG. 3B shows a further schematic plan view of a resonator of a conventional semiconductor laser chip which is formed as an edge emitter, and Each of FIGS. 4a to 4d shows a schematic plan view of a resonator with a plurality of corner reflectors of a semiconductor laser chip of a semiconductor laser device according to an embodiment of the invention which is formed as a pump radiation source.
Figure 4A:
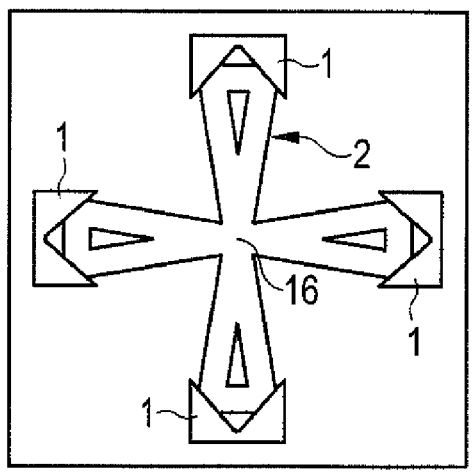
Figure 4B:
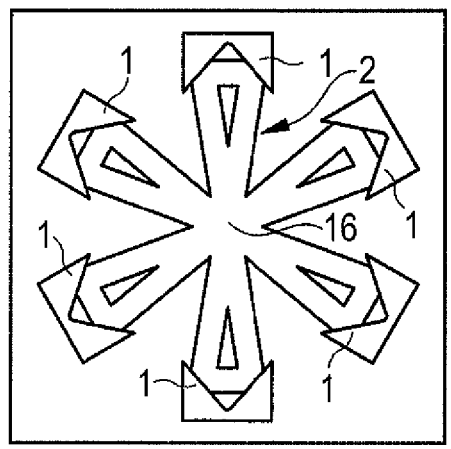
Figure 4C:
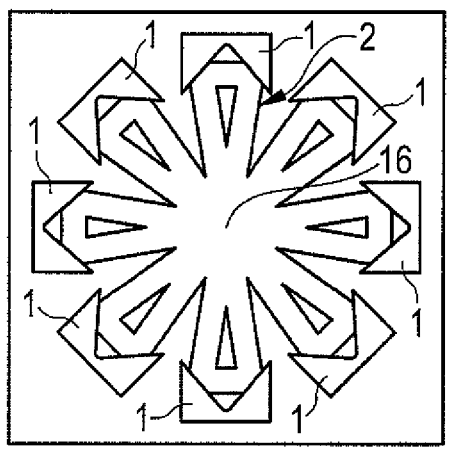
Figure 4D:
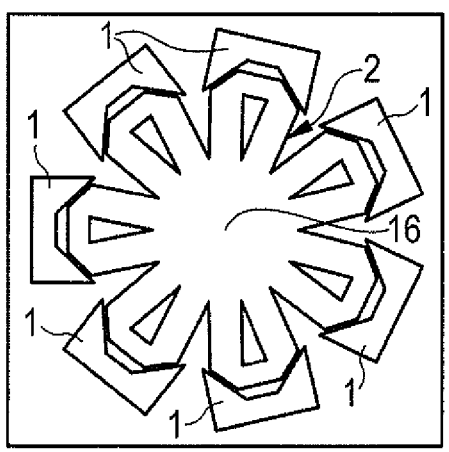

FIGS. 3a and 3b illustrate exemplary embodiments of conventional resonators 10. FIG. 3a shows a conventional resonator 10 arranged in a pump radiation source. A resonator 10 of a structure designed as a conventional edge emitter is shown in FIG. 3b.

The corner reflectors 1 illustrated in FIGS. 3a and 3b have two surfaces 14, 15 arranged at an angle of 90 degrees with respect to one another. The angle of 90 degrees results in a parallel beam path 2 for the radiation 2 which is emitted by the active layer and propagates in the resonator 10.

The resonator 10 has incident beams 3 and emerging beams 4 which result from the emitted radiation of the active layer that propagates in the resonator 10. Radiation impinging on a surface 14 is reflected back by double reflection at both surfaces 14, 15 in precisely the direction from which the radiation came. This means that beams impinge as incident beams 3 on the first reflective surface 14 of the corner reflector 1, are reflected from the first reflective surface 14 of the corner reflector 1 onto the second reflective surface 15 of the corner reflector 1 and are reflected from the second reflective surface 15 in such a way that the emerging beams 4 and the incident beams 3 run parallel to one another.

The beam path 2 meets the point of intersection of the first and the second reflective surface 14, 15 of the corner reflector 1. However, radiation which impinges on or in the vicinity of the right angle of the corner reflector does not follow the beam path of double reflection as described above. As a result, an undesirable intensity minimum can arise in the emission profile of the semiconductor laser chip at the right angle of the corner reflector, said intensity minimum being visible for example as a dark stripe. An inhomogeneous emission characteristic of the radiation emitted by the semiconductor laser chip disadvantageously results.

The exemplary embodiments of a resonator arranged in a semiconductor laser chip which are illustrated in FIGS. 4a to 4d differ from the example from FIG. 2a in that a plurality of corner reflectors 1 are arranged. The corner reflectors 1 form in each case a circulating beam path 2.

The corner reflectors 1 are in each case arranged around the vertical emitter layer in star-shaped fashion. In FIGS. 4a to 4d, the corner reflectors 1 are in each case formed in such a way that the radiation emitted by the active layer in each case impinges on the first reflective surface of a corner reflector 1, is reflected from the first reflective surface onto the second reflective surface and is reflected from the second reflective surface in such a way that the incident beams and the emerging beams do not run parallel to one another and intersect one another.

In FIGS. 4a to 4d, the corner reflectors 1 are arranged with respect to one another such that the points of intersection of the incident beams and the emerging beams of the individual corner reflectors 1 overlap below the vertical emitter layer.

High pump radiation intensity can be obtained in the region of the points of intersection 16. This advantageously results in an improved emission characteristic of the pump radiation source, whereby homogenous optical pumping by the pump radiation source is made possible. That region of the points of intersection 16 of the incident and emerging beams of the individual corner reflectors 1 which is preferably arranged below the vertical emitter layer provides a high intensity of the pump radiation in regions of the semiconductor laser device in which optical pumping of the vertical emitter layer is preferably intended to take place.

In FIGS. 4a to 4d, the corner reflectors 1 are arranged with respect to one another such that the corner reflectors 1 form a resonator in which a circulating beam path 2 is formed, wherein self-contained beam paths 2 of the radiation emitted by the active layer are formed.

The invention is not restricted to the exemplary embodiments by the description on the basis of said exemplary embodiments. But rather, the invention encompasses any new feature and also any combination of features, which in particular comprises any combination of features in the patent claims, even if this feature or this combination itself is not explicitly specified in the patent claims or exemplary embodiments.

We claim:

1. A semiconductor laser device comprising:
   at least one semiconductor laser chip containing an active layer that emits electromagnetic radiation; and
   at least one corner reflector having a first and a second reflective surface formed in the semiconductor laser chip, the first and the second reflective surfaces being arranged at an angle of less than 90 degrees with respect to one another;
   wherein beams emitted by the active layer, impinging as incident beams on the first reflective surface of the at least one corner reflector, are reflected from the first reflective surface onto the second reflective surface and are reflected from the second reflective surface as emerging beams such that the emerging beams and the incident beams do not run parallel to one another.

2. The semiconductor laser device as claimed in claim 1, wherein the incident beams and the emerging beams define a beam path, and the incident beams and the emerging beams intersect one another.

3. The semiconductor laser device as claimed in claim 1, wherein the incident beams and the emerging beams define a beam path that does not meet a point of intersection of the first and the second reflective surfaces of the at least one corner reflector.

4. The semiconductor laser device as claimed in claim 1, wherein the first reflective surface of the at least one corner reflector and the incident beams are arranged at an angle of greater than 20 degrees and less than 45 degrees with respect to one another.

5. The semiconductor laser device as claimed in claim 1, wherein the semiconductor laser chip is formed as an edge emitter.

6. The semiconductor laser device as claimed in claim 1, further comprising:
   a further corner reflector formed in the semiconductor laser chip on a side opposite the at least one corner reflector, said further corner reflector having two reflective surfaces arranged at an angle of less than 90 degrees with respect to one another, and the at least one corner reflector and the further reflector jointly forming a resonator for the electromagnetic radiation emitted by the active layer.

7. The semiconductor laser device as claimed in claim 6, wherein the semiconductor laser chip forms a pump radiation source and a surface emitting vertical emitter laser optically pumped by the pump radiation emitted by the active layer is arranged on the pump radiation source.

8. The semiconductor laser device as claimed in claim 7, wherein the vertical emitter laser has at least one active radiation-generating vertical emitter layer which emits radiation in a vertical main radiation direction and is at a distance from the active layer of the pump radiation source in the vertical main radiation direction.

9. The semiconductor laser device as claimed in claim 8, wherein the semiconductor laser chip is arranged on a substrate, a resonator mirror is arranged between the at least one active radiation-generating vertical emitter layer and the substrate, and the radiation generated by the at least one active radiation-generating vertical emitter layer is coupled out on that side of the surface emitting vertical emitter laser which is opposite to the substrate.

10. The semiconductor laser device as claimed in claim 8, wherein the semiconductor laser chip is arranged on a substrate, a resonator mirror is arranged on that side of the at least one active radiation-generating vertical emitter layer which is opposite to the substrate, and the radiation generated by the at least one active radiation-generating vertical emitter layer is coupled out through the substrate or on a side of the substrate.

11. The semiconductor laser device as claimed in claim 9, wherein the at least one active radiation-generating vertical emitter layer is assigned an external mirror which, together with the resonator mirror, forms a resonator for the surface emitting vertical emitter laser.

12. The semiconductor laser device as claimed in claim 7, wherein a plurality of corner reflectors are arranged around the at least one active radiation-generating vertical emitter layer in a star-shaped manner.

13. The semiconductor laser device as claimed in claim 12, wherein said plural corner reflectors are arranged with respect to one another such that the radiation emitted by the active layer intersects below the at least one active radiation-generating vertical emitter layer.

14. The semiconductor laser device as claimed in claim 12, wherein said plural corner reflectors are arranged with respect to one another such that said plural corner reflectors form a resonator in which a circulating beam path is formed.

15. A semiconductor laser device comprising:
   at least one semiconductor laser chip containing an active layer that emits electromagnetic radiation; and
   at least one corner reflector having a first and a second reflective surface formed in the semiconductor laser chip, the first and the second reflective surfaces being arranged at an angle of less than 90 degrees with respect to one another;

a further corner reflector formed in the semiconductor laser chip on a side opposite the at least one corner reflector, said further corner reflector having two reflective surfaces arranged at an angle of less than 90 degrees with respect to one another, and the at least one corner reflector and the further reflector jointly forming a resonator for the electromagnetic radiation emitted by the active layer;

wherein the semiconductor laser chip forms a pump radiation source and a surface emitting vertical emitter laser optically pumped by pump radiation emitted by the active layer is arranged on the pump radiation source;

wherein the vertical emitter laser has at least one active radiation-generating vertical emitter layer which emits radiation in a vertical main radiation direction and is at a distance from the active layer of the pump radiation source in the vertical main radiation direction; and wherein the semiconductor laser chip is arranged on a substrate, a resonator mirror is arranged between the at least one active radiation-generating vertical emitter layer and the substrate, and the radiation generated by the at least one active radiation-generating vertical emitter layer is coupled out on that side of the surface emitter vertical emitter laser which is opposite to the substrate.

16. A semiconductor laser device comprising:

at least one semiconductor laser chip containing an active layer that emits electromagnetic radiation; and at least one corner reflector having a first and a second reflective surface formed in the semiconductor laser chip, the first and the second reflective surfaces being arranged at an angle of less than 90 degrees with respect to one another;

a further corner reflector formed in the semiconductor laser chip on a side opposite the at least one corner reflector, said further corner reflector having two reflective surfaces arranged at an angle of less than 90 degrees with respect to one another, and the at least one corner reflector and the further reflector jointly forming a resonator for the electromagnetic radiation emitted by the active layer;

wherein the semiconductor laser chip forms a pump radiation source and a surface emitting vertical emitter laser optically pumped by pump radiation emitted by the active layer is arranged on the pump radiation source;

wherein a plurality of corner reflectors are arranged around at least one active radiation-generating vertical emitter layer of the surface emitting vertical emitter laser in a star-shaped manner; and wherein said plural corner reflectors are arranged with respect to one another such that the radiation emitted by the active layer intersects below the at least one active radiation-generating vertical emitter layer.

* * * * *